United States Patent [19]

Yamazaki et al.

[11] Patent Number: 5,185,179
[45] Date of Patent: Feb. 9, 1993

[54] PLASMA PROCESSING METHOD AND PRODUCTS THEREOF

[75] Inventors: Shunpei Yamazaki, Tokyo; Shigenori Hayashi, Atsugi; Noriya Ishida, Atsugi; Mari Sasaki, Atsugi; Junichi Takeyama, Atsugi; Kenji Itou, Zama; Masahiro Kojima; Masaya Kadono, both of Atsugi, all of Japan

[73] Assignee: Semiconductor Energy Laboratory Co., Ltd., Atsugi, Japan

[21] Appl. No.: 417,311

[22] Filed: Oct. 5, 1989

[30] Foreign Application Priority Data

Oct. 11, 1988 [JP] Japan ................................ 63-255491
Mar. 31, 1989 [JP] Japan .................................... 1-82015

[51] Int. Cl.⁵ ........................ B05D 3/12; C23C 16/00
[52] U.S. Cl. .................................. 427/601; 427/249; 427/255; 427/255.7; 427/282; 427/287; 427/290; 427/292; 427/581; 427/577
[58] Field of Search ...................... 427/57, 255.2, 249, 427/255, 255.7, 282, 292, 290, 287, 294, 39, 40

[56] References Cited

U.S. PATENT DOCUMENTS

| | | | |
|---|---|---|---|
| 4,300,989 | 11/1981 | Chang | 427/38 |
| 4,332,837 | 6/1982 | Peyrl-Lavigne | 427/57 |
| 4,345,985 | 8/1982 | Tohda et al. | 427/57 |
| 4,801,474 | 1/1989 | Saitoh et al. | 427/255.7 |
| 4,925,701 | 5/1990 | Jansen et al. | 427/249 |

FOREIGN PATENT DOCUMENTS

| | | |
|---|---|---|
| 0104658 | 4/1984 | European Pat. Off. . |
| 0166708 | 1/1986 | European Pat. Off. . |
| 0175980 | 4/1986 | European Pat. Off. . |
| 0267679 | 5/1988 | European Pat. Off. . |

OTHER PUBLICATIONS

Katograda et al., "Large Area Chemical Vapour Deposition of Diamond Particles and Films Using Magneto-Microwave Plasma" in Japanese Journal of Applied Physics, vol. 26, No. 6, Jul. 1987.

*Primary Examiner*—Janyce Bell
*Attorney, Agent, or Firm*—Sixbey, Friedman, Leedom & Ferguson

[57] ABSTRACT

Carbonaceous films are coated on a surface by chemical vapor reation. In advance of the deposition of carbonaceous film, a silicon nitride film as coated on the surface to prevent interdiffusion between the carbonaceous film and the underlying surface.

10 Claims, 6 Drawing Sheets

FIG.4(A)
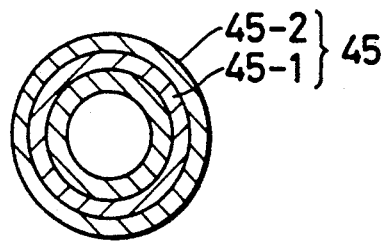
FIG.5(A)
FIG.4(B)
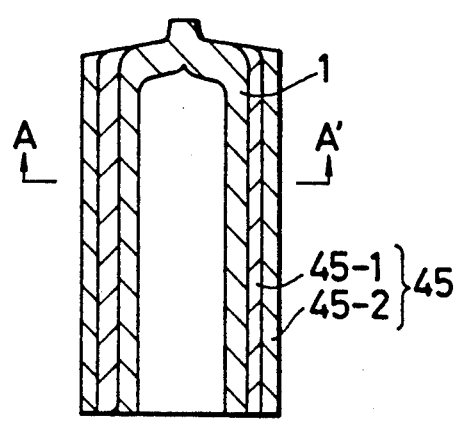
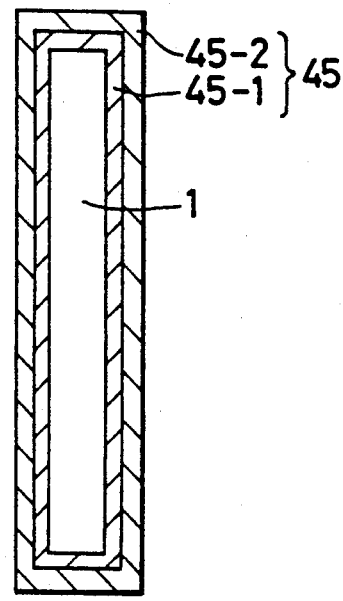
FIG.5(C)
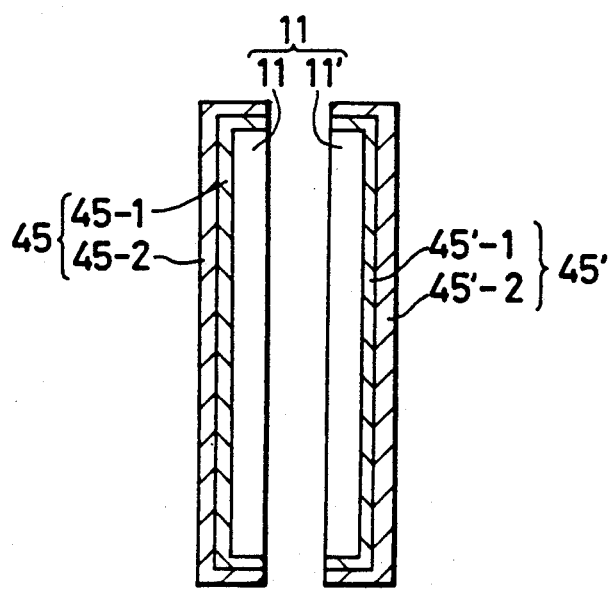
FIG.5(B)
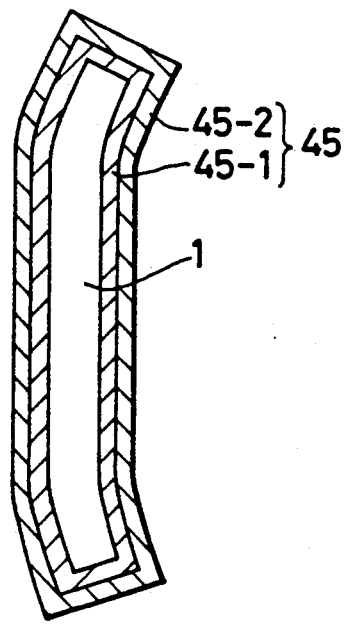

PLASMA PROCESSING METHOD AND PRODUCTS THEREOF

BACKGROUND OF THE INVENTION

The present invention relates to an improved plasma processing method and products thereof. More particularly, but not exclusively, it relates to a method of adhering a protective film of carbonaceous material to comparatively soft substrates in order to provide a transparent electrically insulating coating thereon.

Hard, thin films of diamondlike carbon have been deposited on substrates in a number of ways. By "diamondlike carbon" is meant carbon with exceptional hardness, e.g. which can neither be cut with a razor blade nor scratched by rubbing with steel wool. The chemical bonding of such diamondlike carbon appears to be dominated by $sp^3$ tetrahedral diamondlike bonding as opposed to the $sp^2$ trigonal bonding of graphite. Diamondlike carbon films may or may not give evidence of crystallinity by x-rays.

Japanese Patent Application No. Sho 56-146936 describes a process in which carbon deposition is carried out with the deposited carbon material being subject to the attack by accelerated ions at the same time so that soft portions of the deposited material are selectively removed to leave comparatively hard material. This technique is excellent for increasing the hardness of the carbon film thus deposited. The carbon being deposited, however, tends to penetrate into the underlying substrate. FIGS. 1(A) and 1(B) shows an example. A carbon film 2 was deposited on a Si substrate 3 by chemical vapor reaction. The substrate was then subjected to Auger analysis in order to investigate the distribution of carbon atoms and Si atoms along the depth direction. As a result, a mixture film was formed at the interface between the substrate 3 and the carbon film 2 as shown in FIG. 1(B). The silicon carbon mixture is relatively soft and tends to increase liklihood of causing the carbon film to come off from the underlyin substrate particularly when the carbon film has been relatively thick.

Furthermore, when fluorine is desired to be introduced into carbon films in order to control the transparency and the resistivity or to improve the hydrophilic property of the carbon films, the underlying surface to be coated is exposed during the deposition to a caustic fluorine gas and may be damaged.

SUMMARY OF THE INVENTION

It is therefore an object of the present invention to provide a plasma processing technique for deposition of carbonaceous films of a new type.

In order to accomplish the above and other objects and advantages, a nitride film such as a silicon nitride film is deposited on the underlying surface to be coated in advance of deposition of a carbonaceous film. In accordance with one aspect of the present invention, a fluorine compound gas is used together with a carbonaceous gas in order to endow a hydrophilic property to the carbonaceous film deposited. This is particularly desirable when the external surfaces of windows of a vehicle are coated with abrasion-proof hard carbonaceous films because rain remaining the window surface can be prevented from forming a number of fine drops which cause irregular reflection and form an obstacle to views. The silicon nitride film functions to prevent the underlying surface from undesirable causic action of fluorine exerted upon the surface during deposition. In accordance with another aspect of the present invention, carbonaceous films can be selectively deposited on a predetermined surface portion by giving a pre-treatment to the predetermined portion. The pre-treatment is to give a number of fine scrachs on the surface portion. Diamond can be selectively grown on the scratched surface. Scratching can be performed, for example, by coating a substrate to be treated with a mask, dipping the same in a fluid in which dispersed are hard fine particles such as diamond particles or carborumdum particles, and applying ultrasonic vibrations to the dispersion.

BRIEF DESCRIPTION OF THE DRAWING

This invention can be better understood from the following detailed description when read in conjunction with the drawing in which FIG. 1(A)

FIG. 4 (A) and FIG. 4 (B) is a cross sectional views showing a printing drum for coping machines which has been coated with a carbonaceous protective film in accordance with the present invention.

FIGS. 5(A) and 5(B) are vertical and horizontal cross sectional views showing a window glass for motor cars which has been coated with a carbonaceous protective film in accordance with the present invention.

FIG. 5(C) is a schematic cross sectional view showing a modification of the embodiment shown in FIGS. 5(A) and 5(B).

DETAILED DESCRIPTION OF THE PREFERRED EMBODIMENTS

Figure 1A:
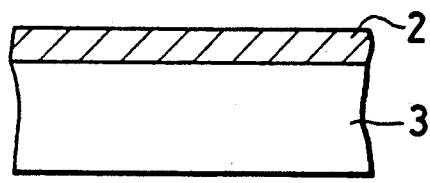
FIG. 1(B) is a graphical diagram showing penetration of carbon atoms into an underlying silicon substrate in accordance with prior art.
Figure 1B:
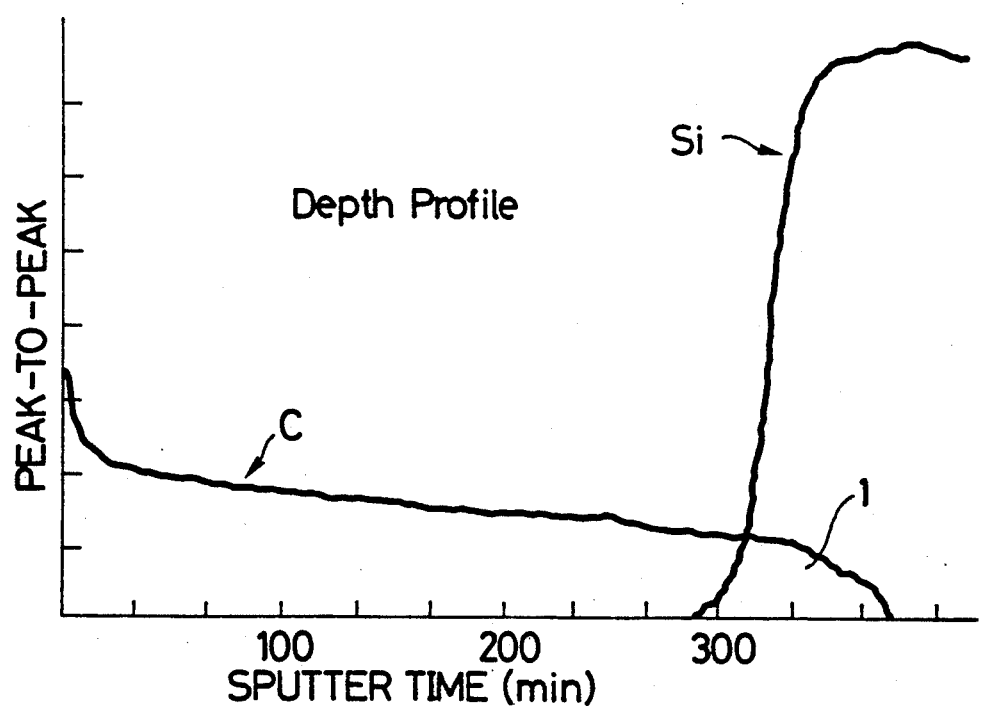
Figure 2:
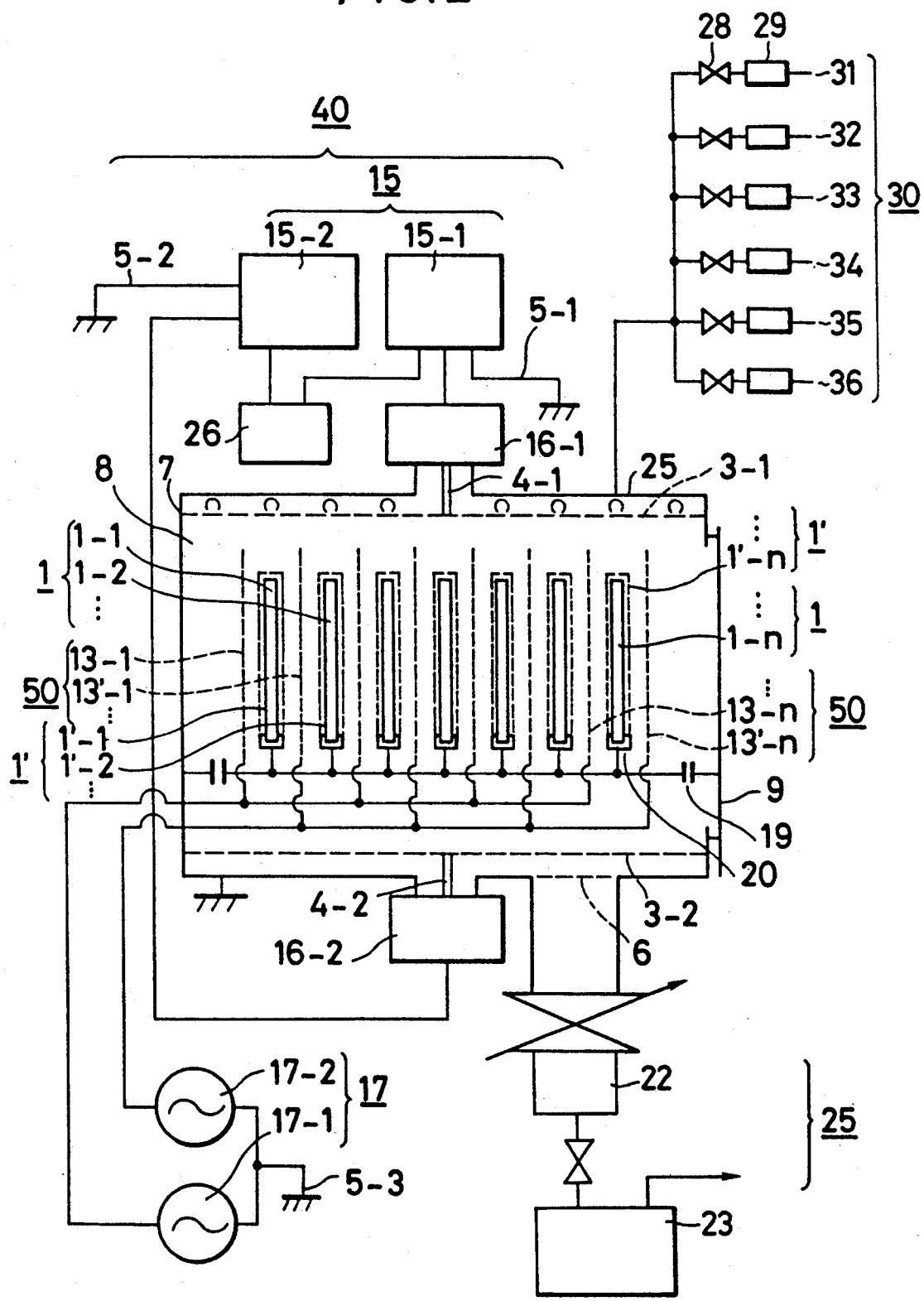
FIG. 2 is a schematic cross sectional diagram showing a plasma CVD apparatus in accordance with one embodiment of the present invention.

Referring now to FIG. 2, a chemical vapor deposition apparatus is illustrated. The apparatus comprises a vacuum chamber 9 defining a deposition space therein, an evacuation system 25 comprising a rotary pump 23 and a turbo molecular pump 22 which are connected to the chamber 7 through a valve 21, a gas supply system 30 comprising four gas feeding lines, each being provided with a flow meter 29 and a valve 28 connected to the reaction chamber 7, a pair of mesh electrodes 3-1 and 3-2 made of alminum and located at upper and lower positions inside of the deposition space, a power supply 40 for supplying energy to the mesh electrodes 3-1 and 3-2, a plurality of substrate holders 20 for holding substrates 1, the holders 20 being connected to the chamber 7 through capacitors 19, a plurality of A1 mesh electrodes 50 (13-n, 13'-n) interposed between adjacent substrates and outside of the first and last substrates, and a bias voltage applying means 17 for applying an AC voltage between adjacent ones of the electrodes 50. The reaction chamber 7 is provided with a gate valve 9 through which substrates to be cated may be disposed in the chamber.

The energy supply 40 comprises a first power source 15-1 which supplies an AC voltage to the mesh electrode 3-1 through a matching device 16-1 comprising a LCR circuit, a second power source 15-2 which supplies an AC voltage to the mesh electrode 3-2 through a matching device 16-2 comprising a LCR circuit, and a phase adjuster 26 connected between the first and second powder sources 15-1 and 15-2. Both the first and second power sources are grounded at terminals 5-1 and 5-2. The bias applying device 17 is provided with first and second AC voltage sources 17-1 and 17-2, which supply AC voltages between adjacent electrodes 13-n and 13'-n. One terminal of each of the voltage sources 17-1 and 17-2 is grounded at 5-3.

In operation, after evacuating the chamber 7, a reactive gas is introduced into the deposition space 8 at a pressure of from 0.001 to 1 Torr in order to deposit silicon nitride film on the substrate. For example, the reactive gas may consist of a silane such as disilane ($Si_2H_6$) and $NH_3$ in the ratio of from 1:10 to 10:1, preferably from 1:10 to 3:10 and may be introduced so that the total pressure in the reaction chamber 7 becomes from 0.001 Torr to 1.0 Torr, e.g. 0.05 Torr. The temperature in the deposition space is no higher than 150° C., e.g. room temperature without heating. High frequency alternating voltages of from 1 MHz to 100 MHz, e.g. 13.56 MHz, are applied to the mesh electrodes 3-1 and 3-2 from the first and second power sources 15-1 and 15-2. The phase difference between these high frequency voltages is adjusted to be 180°±30° by means of the phase adjuster 26. Alternatively, the frequency of one of these voltages may be adjusted at an integer multiple of that of the other. By virtue of the injection of such high frequency electric energy into the plasma chamber, the reactive gas is converted into a plasma state and silicon nitride ($Si_3N_{4-x}$; $0 \leq x < 4$) is deposited onto the substrates. The thickness of the deposited films may be from 0.01 to 0.1 micrometers. Optionally, at the same time, an AC voltage may be applied between adjacent electrodes 13-n and 13'-n in order to induce an electric field normal to each substrate. The frequency of the AC voltage between the electrodes 13-n and 13-n' is selected to be in the range of from 10 Hz to 100 KHz, e.g., 50 Hz. At such comparatively low frequencies, plasma ions can follow the electric field and bombard the substrate surfaces on which carbon deposition is being carried out. This low frequency AC voltage causes a self-bias voltage of from −50 V to −600 V.

Next, after the completion of the silicon nitride deposition, a carbon compound gas is introduced into the deposition space 8 at a pressure of from 0.001 to 1 Torr. For example, the carbon compound gas consists of $C_2F_6$ and $C_2H_4$ in the ratio of from 1:4 to 4:1, e.g. 1:1, and may be introduced so that the pressure in the reaction chamber 7 becomes 0.5 Torr. The transparency and resistivity of the carbon material that is deposited can be controlled by changing the amount of fluorine contained in the carbon material through adjustment of the introduction rate of $C_2F_6$ relative to $C_2H_4$. The temperature in the deposition space is no higher than 150° C. High frequency alternating voltages of from 1 MHz to 100 MHz, e.g. 13.56 MHz, are applied to the mesh electrodes 3-1 and 3-2 from the first and second power sources 15-1 and 15-2. The phase difference between these high frequency voltages is adjusted to be 180°±30° by means of the phase adjuster 26. By virtue of the injection of such high frequency electric energy into the plasma chamber, the carbon compound gas is converted into a plasma state and carbon deposition onto the substrates occurs. The deposition rate is from 100 to 1000 Å/min. The thickness of the deposited carbon films may be from 0.1 to 8 micrometers on flat surfaces and from 1 to 3 micrometers on uneven surfaces. At the same time, an AC voltage is applied between adjacent electrodes 13-n and 13'-n in order to induce an electric field normal to each substrate. The frequency of the AC voltage between the electrodes 13-n and 13-n' is selected to be in the range of from 10 Hz to 100 KHz, e.g., 50 Hz. At such comparatively low frequencies, plasma ions can follow the electric field and bombard the substrate surfaces on which carbon deposition is being carried out. As a result, softer deposited materials are removed so that the hardness of the carbon material that remains is relatively high, e.g. 700 to 5000 kg/mm². The resistivity of the carbon is for example from $1 \times 10^6$ to $5 \times 10^{13}$ ohm centimeter, typically from $1 \times 10^7$ to $1 \times 10^{11}$ ohm centimeter. The optical energy band gap is no narrower than 1.0 eV, typically 1.5 to 5.5 eV. The carbon material is called diamondlike carbon. The carbon material may include hydrogen at 30 atom % or less and fluorine at 0.3 to 10 atom %. Other examples of carbon compound gases are ethylene, methane, acetylene, carbon fluorides such as $C_2F_6$ and $C_3F_8$, $CHF_3$, $H_2CF$ and $CH_2F_2$.

Figure 3:
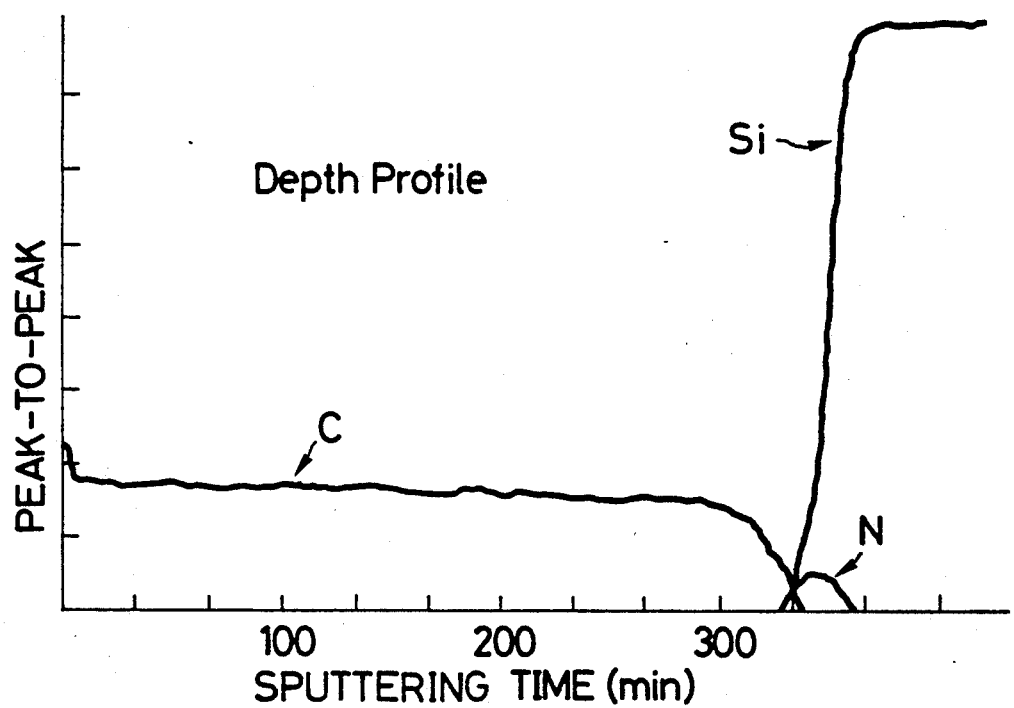
FIG. 3 is a graphical diagram showing penetration of carbon atoms into an underlying silicon substrate in accordance with the present invention.
Figure 6:
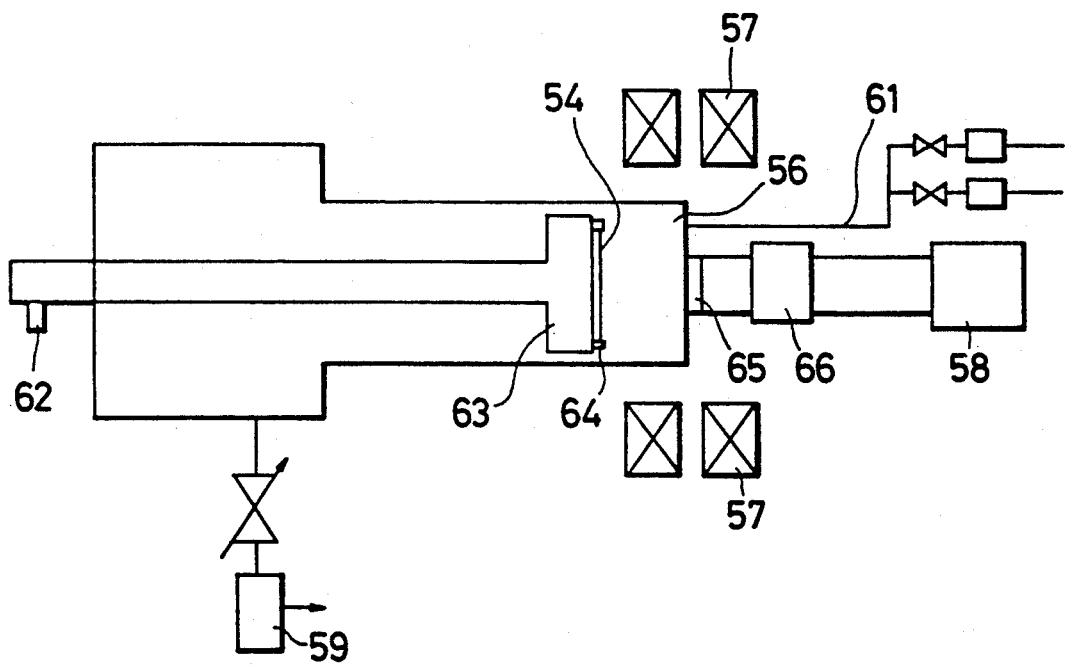
FIG. 6 is a schematic cross sectional diagram showing a microwave assisited CVD apparatus in accordance with one embodiment of the present invention.
Figure 7A:
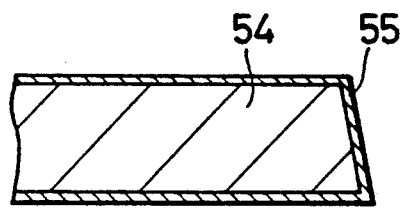
FIGS. 7(A) through 7(C) are cross sectional views showing a carbonaceous film coating process on a bite in accordance with the present invention.
Figure 7B:
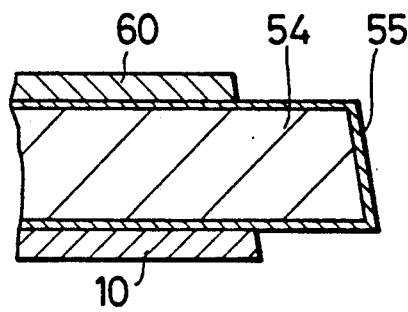
Figure 7C:
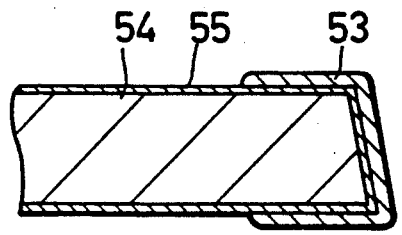

Auger analysis was performed in order to investigate the composition along in the thickness direction of silicon nitrogen and carbonaceous films deposited in accordance with the present invention. As a result, a graphical diagram shown in FIG. 3 was obtained. As seen from the diagram, carbon atoms have substantially not penetrated into the underlying silicon substrate in light of the silicon nitride film.

Carbonaceous films were coated on several substrates in accordance with the present invention. FIGS. 4(A) and 4(B) are horizontal and vertical cross sectional views showing a printing drum for copying machines. Numeral 1 designates an Al drum coated with an OPC (organic photosensitive conductor) film. A silicon nitride film 45-1 was deposited on the external surface of the drum to a thickness of from 0.01 to 0.1 micrometer in the same manner as explained above. A carbonaceous film 45-2 was next deposited on the silicon nitride film 45-1 also in the same manner as above. Optionally, 0.3 atom % to 10 atom % of boron or nytrogen may be introduced into the cabonaceous film by making use of $B_2H_6$ or $NH_3$ during carbon depostion. Also, instead of a uniform carbonaceous film, a dual film can be deposited by first deposition of 100 to 2000 Å thick underlying carbon film by use of ethylene alone, followed by deposition by use of a reative gas comprising carbon and fluorine as described in the above.

FIGS. 5(A) and 5(B) are horizontal and vertical cross sectional views showing a curved glass or plastic pane 1 to be fitted in the front window of a motor car, the pane 1 being coated with a silicon nitrogen film 45-1 and a carbonaceous film 45-2 of from 0.1 to 8 micrometers in accordance with the present invention. The whole surface of the glass pane 1 would be coated with carbon film in accordance with the present invention. This film can be coated only one side of the pane. In this case, the panes treated in the apparatus shown in FIG. 2 are disposed in parallel with each other in order to make pairs as illustrated in FIG. 5.

The deposition chamber may be cleaned after deposition by introducing an etchant gas such as oxygen or NF$_3$ instead of the reactive gas. Unnecessary carbonaceous films and nirtogen films can be removed by inputting electric energy in the same manner as the deposition process to preform plasma etching.

It is possible to coat only a selected surface portion of a substrate. In this case, the selected surface is given a number of scratchs which attract species. Referring to FIG. 6 and FIGS. 7(A) to 7(C), a method of selective deposition will be illustrated. A microwave assisted CVD apparatus comprising a vacuum chamber 56, a vacuum pump 59, a substrate holder 63 for supporting thereon a substrate to be coated, the holder being provided with a temperature control device therein (not shown), a substrate location adjustment mechanism 62, a microwave generator 58 connected to the vacuum chamber 56 through an insulator 66 and a quartz window 65, Helmholtz coils 57 surrounding the end of the vacuum chamber 56, and a gas feeding system 61.

Steel bites 54 are placed on the holder 63. The distance between the surfaces of the bites 54 and the window 65 is adjusted to be 150-250 mm by means of the adjustment mechanism 62. After evacuating, a reactive gas consisting of Si$_2$H$_6$ and NH$_3$ is introduced into the vacuum chamber at from 100 Pa to $10^{-2}$ Pa. The strength of magnetic field at the surface to be coated is adjusted at 2.2K Gauss. Microwaves are then input to the chamber from the generator 58 at 50 W to deposit silicon nitride films 55 on the bites to a thickness of from 0.01 micrometer to 0.1 micrometer. The temperature is maintained at a temperature not lower than 350° C., preferably not lower than 800° C. Higher adhesivity can be expected at a higher temperature. After completing the deposition, the bites are removed from the chamber and coated with a mask 60 made from a photoresist covering selected surface portions as shown in FIG. 6(B). The bites are then dipped in an alcohol in which diamond powder comprising fine particles of 1 micrometer average diameter is dispersed. Ultrasonic vibrations are applied to the dispersion in order to give a number of scratchs on the surface portion free of the masks. The masks are removed and the bites are disposed again in the chamber. Then, a vaporized alcohol is inputted into the chamber at $10^2$ to $10^{-2}$ Pa, e.g. 10 Pa and decomposed by microwave energy in the same manner in order to grow diamond film to a thickness of 3 micrometers at 900 Å/mim on the scratched surfaces as shown in FIG. 6(C). The alcohol is for example ethyle alcohol, methyl alcohol or propyl alcohol. The hardness of the diamond film can be expected not lower than 5000 Kg/mm$^2$. The dispersion in film thickness is within ±10% in a circular area of 100 mm diameter. In accordance with experiment using ethyle alcohol introduced at 40 SCCM together with hydrogen (100 SCCM) in order that the total pressure in the reaction chamber was 13 Pa, it was confirmed that the carbon structure is diamond structure by raman spectra having a sharp peak at 1331 cm$^{-1}$. The diamond film did not come off from the underlying surface even after undergoing reliability test of thermal shock between $-10°$ C. and 150° C. The experiment was repeated using a reactive gas consisting of methyl alminium and ammonia in order to deposit an aluminium nitride film. The nitride film then was subjected to thermal annealing at anout 400° C.

While several embodiments have been specifically described by way of examples, it is to be appreciated that the present invention is not limited to the particular examples described and that modifications and variations can be made without departing from the scope of the invention as defined by the appended claims. For example, the present invention is usuful when front, side or rear windows or side mirrors are coated with carbon protective films. Although in the above embodiment a silicon nitride film is formed underlying the cabonaceous film, other nitride films can be used instead. For example, the nitride film can be made from aluminum nitride, titan nitride or boron nitride.

What is claimed is:

1. A method of selectively forming a diamond film on a substrate comprising the steps of:
    coating a mask on said substrate;
    scratching the surface of said substrate except the portion that has been covered with said mask;
    removing said mask; and
    disposing said substrate in a reaction chamber;
    growing a diamond film on the scratched surface of said substrate through chemical vapor reaction in said reaction chamber.

2. The method of claim 1 further comprising a step of coating a nitride film selected from the group consisting of silicon nitride, titanium nitride, aluminum nitride, and boron nitride on said substrate in advance of the mask coating step.

3. The method of claim 1 wherein said diamond film growing step is carried out at a temperature not lower than 350° C.

4. The method of claim 1 wherein said scratching step is carried out by dipping said substrate in a fluid in which a number of hard particles are dispersed and applying a ultrasonic vibration.

5. The method of claim 4 wherein said hard particles are diamond particles.

6. A method of forming a diamond film on a substrate comprising the steps of:
    providing said substrate with fine scratches;
    disposing said substrate in a reaction chamber; and
    growing a diamond film on said substrate through chemical vapor reaction in said reaction chamber,
    wherein said fine scratches are formed by the steps of
    disposing a surface of said substrate in a liquid in which hard particles are distributed; and
    applying an ultrasonic vibration to said particles.

7. The method of claim 6 further comprising a step of providing a nitride film selected from the group consisting of silicon nitride, titanium nitride, aluminum nitride, and boron nitride on said selected portion of said substrate and thereafter providing said fine scratches on the surface of the nitride film.

8. The method of claim 6 wherein said diamond growing step is carried out at a temperature not lower than 350° C.

9. The method of claim 6 wherein said hard particles are diamond particles.

10. A method of forming a diamond film on a substrate comprising the steps of:
    pretreating a surface of said substrate and forming diamond film on the surface of said substrate by a CVD method, wherein said pretreating step comprises the steps of
    disposing a surface of said substrate in a liquid in which fine particles are distributed; and
    applying an ultrasonic vibration to said particles.

* * * * *